United States Patent
Choi et al.

(10) Patent No.: US 9,502,576 B2
(45) Date of Patent: Nov. 22, 2016

(54) THIN FILM TRANSISTOR AND METHOD FOR MANUFACTURING THE SAME, ARRAY SUBSTRATE, DISPLAY DEVICE

(71) Applicant: BOE TECHNOLOGY GROUP CO., LTD., Beijing (CN)

(72) Inventors: Seungjin Choi, Beijing (CN); Heecheol Kim, Beijing (CN); Youngsuk Song, Beijing (CN); Seongyeol Yoo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 31 days.

(21) Appl. No.: 14/406,667

(22) PCT Filed: Apr. 18, 2014

(86) PCT No.: PCT/CN2014/075670
§ 371 (c)(1),
(2) Date: Dec. 9, 2014

(87) PCT Pub. No.: WO2015/096309
PCT Pub. Date: Jul. 2, 2015

(65) Prior Publication Data
US 2015/0303306 A1    Oct. 22, 2015

(30) Foreign Application Priority Data
Dec. 26, 2013   (CN) .......................... 2013 1 0728554

(51) Int. Cl.
*H01L 29/786*  (2006.01)
*H01L 29/66*   (2006.01)
*H01L 29/423*  (2006.01)

(52) U.S. Cl.
CPC ..... *H01L 29/7869* (2013.01); *H01L 29/42384* (2013.01); *H01L 29/66969* (2013.01); *H01L 29/78603* (2013.01)

(58) Field of Classification Search
CPC ..................... H01L 29/7869; H01L 29/66969
USPC ............................................................ 257/43
See application file for complete search history.

(56) References Cited

U.S. PATENT DOCUMENTS 5,557,126 A * 9/1996 Cunningham .... H01L 29/42384
257/330
2010/0075451 A1* 3/2010 Yoo ..................... H01L 27/1218
438/34

(Continued)

FOREIGN PATENT DOCUMENTS

CN       1979314 A    6/2007
CN       101162325 A  4/2008

(Continued)

OTHER PUBLICATIONS

Chinese Office Action of Chinese Application No. 201310728554.9, mailed Dec. 1, 2014 with English translation.

(Continued)

*Primary Examiner* — Kenneth Parker
*Assistant Examiner* — Warren H Kilpatrick
(74) *Attorney, Agent, or Firm* — Collard & Roe, P.C.

(57) ABSTRACT

There are provided a thin film transistor and a manufacturing method thereof, an array substrate and a display device. The thin film transistor is formed on a base substrate, and includes a gate electrode, an active layer, a source electrode and a drain electrode, the gate electrode includes a first section, a second section and a third section, the first section and the third section correspond to locations of the source electrode and the drain electrode, respectively; the base substrate has two recesses formed therein, and the first section and the third section are situated in the two recesses, respectively; the first section and the third section are covered with a filling layer; the filling layer and the second section are covered with a gate insulating layer, the active layer, the source electrode and the drain electrode in sequence.

20 Claims, 4 Drawing Sheets

(56) References Cited

U.S. PATENT DOCUMENTS

2011/0159626 A1* 6/2011 Tsuchiya ................. B81B 3/007
438/50
2012/0327321 A1 12/2012 Huang et al.
2013/0264564 A1* 10/2013 Park .................. H01L 29/66742
257/43

FOREIGN PATENT DOCUMENTS

| CN | 101552277 A | 10/2009 |
| CN | 103257497 A | 8/2013 |
| CN | 103730511 A | 4/2014 |
| JP | H0766419 A | 3/1995 |

OTHER PUBLICATIONS

International Search Report, International Preliminary Report on Patentability and Written Opinion of the International Searching Authority of PCT/CN2014/075670 in Chinese, mailed Jul. 9, 2014.

Second Chinese Office Action of Chinese Application No. 201310728554.9, mailed May 22, 2015 with English translation.

English translation of the International Preliminary Report on Patentability and Written Opinion of the International Searching Authority of PCT/CN2014/075670, issued Jun. 28, 2016.

* cited by examiner

THIN FILM TRANSISTOR AND METHOD FOR MANUFACTURING THE SAME, ARRAY SUBSTRATE, DISPLAY DEVICE

CROSS REFERENCE TO RELATED APPLICATIONS

This application is the National Stage of PCT/CN2014/075670 filed on Apr. 18, 2014, which claims priority under 35 U.S.C. §119 of Chinese Application No. 201310728554.9 filed on Dec. 26, 2013, the disclosure of which is incorporated by reference.

TECHNICAL FIELD

Embodiments of the present invention relate to a thin film transistor and a method for manufacturing the same, an array substrate, a display device.

BACKGROUND

With the unceasing development of display technology, Thin Film Transistor Liquid Crystal Displays (TFT-LCDs) play a leading role in the field of flat panel display as they have the merits of small volume, low power consumption, irradiation-free, etc.

A thin film transistor usually includes a gate electrode, an active layer, a source electrode and a drain electrode, and the gate electrode and the active layer are separated with a gate insulating layer. When a drive signal is input into the gate electrode, the drain electrode can be conducted to the source electrode through the active layer. At present, in more and more thin film transistors, an oxide semiconductor material is used as the active layer. In this case, the active layer may usually be covered by an Etch Stop Layer (ESL) further, so as to protect the active layer, and via holes are formed on the etch stop layer, so that the source electrode and the drain electrode are connected to the active layer through the via holes.

It is found by the inventor in the course of implementing the invention that, the prior art at least suffers from the following issue. In such a scheme that an oxide semiconductor material is used as the active layer, especially when an etch stop layer is employed, overlapping areas between the gate electrode and the source electrode and between the gate electrode and the drain electrode are relatively large, so that a capacitance Cgs formed between the gate electrode and the source electrode and a capacitance Cgd formed between the gate electrode and the drain electrode are relatively large. Thus, the conductive properties of the thin film transistor are affected.

SUMMARY

According to embodiments of the present invention, there are provided a thin film transistor and a manufacturing method thereof, an array substrate provided with the thin film transistor and a display device provided with the array substrate, so as to solve such a technical problem that Cgs and Cgd are larger in an existing thin film transistor.

In order to achieve the above objective, embodiments of the invention adopt the following technical solutions.

According to the invention, there is provided a thin film transistor, comprising a gate electrode, an active layer, a source electrode and a drain electrode, and being formed on a base substrate, wherein the gate electrode includes a first section, a second section and a third section, the first section and the third section are located on both sides of the second section, respectively, the first section corresponds to a location of the source electrode, and the third section corresponds to a location of the drain electrode;

the base substrate has two recesses formed therein, and the first section and the third section are situated in the two recesses, respectively;

the first section and the third section are covered with a filling layer;

the filling layer and the second section are covered with a gate insulating layer;

the active layer is disposed on the gate insulating layer;

the source electrode and the drain electrode are located over the active layer, and are connected to the active layer.

In an example, thickness of the recesses is in the range of 0.3 to 1.0 μm, and is such as 0.5 μm.

In an example, material for the active layer is an oxide semiconductor.

In an example, the active layer is covered with an etch stop layer, the etch stop layer has via holes provided therein, and the source electrode and the drain electrode are connected to the active layer through the via holes.

In an example, material for the filling layer is a transparent resin, and especially is a polyacrylamide resin.

In an example, the active layer includes a channel zone located in the middle and a source zone and a drain zone located on both sides of the channel zone, and the source zone, the channel zone and the drain zone are disposed in opposition to the first section, the second section and the third section of the gate electrode, respectively.

In an example, the source electrode and the drain electrode are connected to the source zone and the drain zone of the active layer, respectively.

According to the invention, there is further provided a manufacturing method of the above-mentioned thin film transistor, comprising:

etching a base substrate, so as to form two recesses;

forming pattern of a gate electrode on the base substrate through a patterning process, the gate electrode including a first section, a second section and a third section, the first section and the third section being located on both sides of the second section, respectively, and being situated in the two recesses, respectively;

covering the gate electrode with a filling layer;

removing the filling layer located over the second section;

forming pattern of a gate insulating layer through a patterning process;

forming pattern of an active layer through a patterning process;

forming pattern of a source electrode and a drain electrode through a patterning process, the source electrode corresponding to a location of the first section, and the drain electrode corresponding to a location of the third section.

In an example, material for the active layer is an oxide semiconductor.

In an example, after pattern of the active layer is formed through a patterning process, it further includes:

forming pattern of an etch stop layer through a patterning process, with via holes being provided in the etch stop layer;

making the source electrode and the drain electrode formed subsequently be connected to the active layer through the via holes.

According to the invention, there is further provided an array substrate, with a number of thin film transistors as stated above arranged in an array form being provided thereon.

According to the invention, there is further provided a display device, comprising the array substrate as stated above.

The above technical solutions provided by the invention have the following merits. Two recesses are formed on the base substrate, so that the first section in correspondence with the source electrode and the third section in correspondence with the drain electrode in the gate electrode are each situated in a recess, and furthermore, the filling layer is added to be located over the first section and the third section, thereby increasing the distance between the first section and the source electrode and the distance between the third section and the drain electrode. Thus, sizes of the Cgs and Cgd are decreased, and conductive properties of thin film transistor are enhanced.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Figure 1:
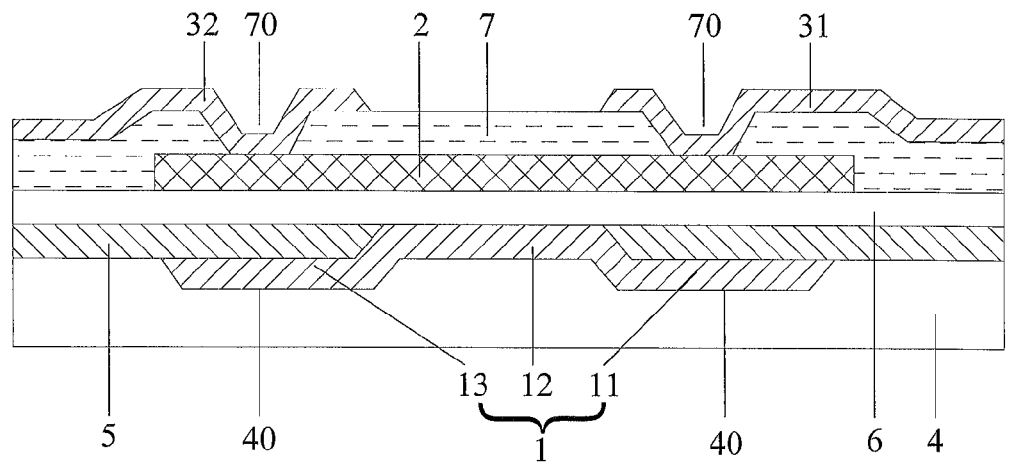
FIG. 1 is a schematic view illustrating a thin film transistor provided by an embodiment of the invention.

As illustrated in FIG. 1, a thin film transistor provided by an embodiment of the invention includes a gate electrode 1, an active layer 2, a source electrode 31 and a drain electrode 32, and the thin film transistor is formed on a base substrate 4. The gate electrode 1 includes a first section 11, a second section 12 and a third section 13, the first section 11 and the third section 13 are located on both sides of the second section 12, respectively, the first section 11 corresponds to the location of the source electrode 31, and the third section 13 corresponds to the location of the drain electrode 32. For example, the first section 11 is opposed to the source electrode 31 at least in part, and the third section 13 is opposed to the drain electrode 32 at least in part.

Two recesses 40 are formed in the base substrate 4, and the first section 11 and the third section 13 are situated in the two recesses 40, respectively. The depth of the recesses is such as in the range of 0.3 to 1.0 μm, and is preferably 0.5 μm. Sizes of the recesses 40 (e.g., sizes in the direction of being parallel to the substrate in a sectional diagram of FIG. 1) correspond to sizes of the source electrode 31 and the drain electrode 32. The first section 11 and the third section 13 are covered by a filling layer 5, and the filling layer 5 and the second section 12 are covered by a gate insulating layer 6. Material for the filling layer 5 is such as a transparent resin, and that used in the embodiment is a polyacrylamide resin. The active layer 2 is disposed on the gate insulating layer 6, and the source electrode 31 and the drain electrode 32 are located on the active layer 2, and are both connected to the active layer 2.

As an embodiment, material for the active layer 2 is an oxide semiconductor. In other embodiments, material for the active layer 2 may also be other kind of semiconductor.

Further, the active layer 2 is covered by an etch stop layer 7, for protecting the active layer 2 of an oxide semiconductor material. Via holes 70 are provided in the etch stop layer 7, and the source electrode 31 and the drain electrode 32 are connected to the active layer 2 through the via holes 70.

In the thin film transistor provided by embodiments of the invention, two recesses 40 are formed on the base substrate 4, so that the first section 11 in correspondence with the source electrode 31 and the third section 13 in correspondence with the drain electrode 32 in the gate electrode 1 are each situated in a recess 40, and the filling layer 5 is added to be located over the first section 11 and the third section 13, thereby increasing the distance between the first section 11 and the source electrode 31 and the distance between the third section 13 and the drain electrode 32. Thus, sizes of the Cgs and Cgd are decreased, and conductive properties of thin film transistor are enhanced.

Figure 2A:
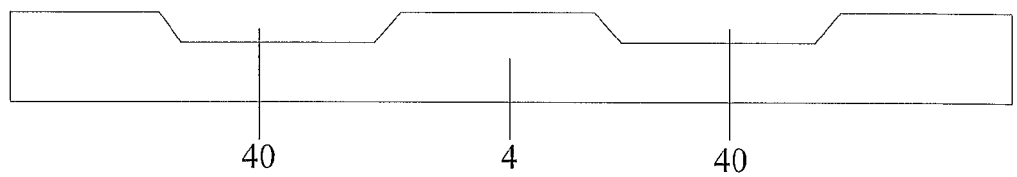
FIG. 2a to FIG. 2h are schematic views illustrating a manufacturing process of a thin film transistor provided by an embodiment of the invention.

According to the invention, there is further provided a manufacturing method of the above-mentioned thin film transistor, comprising:

S1: as illustrated in FIG. 2a, etching is conducted on a base substrate 4, so as to form two recesses 40.

A glass substrate may be usually used as the base substrate 4. In this step, the base substrate 4 may be etched by using a conventional method of etching glass, and for example, the base substrate 4 is etched by using a method of laser irradiation. Alternatively, it may also be possible that a patterning process is adopted, so that two recesses 40 are formed on the base substrate 4 after it is subjected to exposure, development, etch and other processes.

S2: pattern of a gate electrode is formed on the base substrate through a patterning process.

Figure 2B:
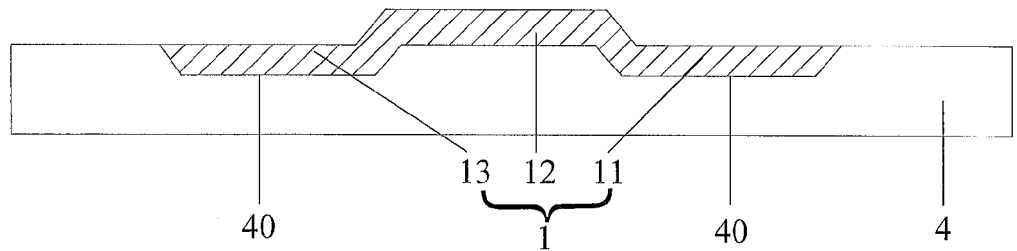

As illustrated in FIG. 2b, specifically, a conventional patterning process may be employed, so that a gate electrode 1 can be formed after it is subjected to exposure, development, etch and other processes. The formed gate electrode 1 includes a first section 11, a second section 12 and a third section 13, and the first section 11 and the third section 13 are located on both sides of the second section 12, respectively, and are situated in the two recesses 40, respectively.

Figure 2C:
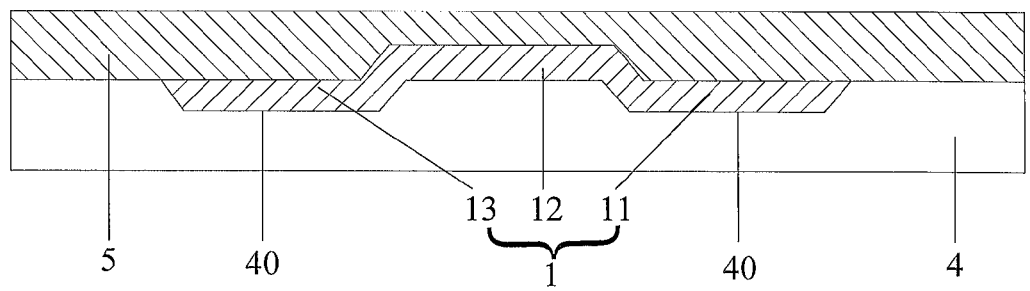

S3: as illustrated in FIG. 2c, after the above steps being accomplished, the gate electrode 1 is covered by a filling layer 5.

Material for the filling layer 5 is such as a transparent resin, and that used in the embodiment is a polyacrylamide resin. In other embodiments, other material than resin may also be used as the filling layer 5.

As the first section 11 and the third section 13 of the gate electrode 1 are situated in the recesses 40, they will be located lower than the second section 12. Thickness of the coated filling layer 5 may be usually in the range of 0.5 to 3.0 μm, and may be adjusted appropriately. After coverage of the filling layer 5 is ended, the filling layer 5 over the first section 11, the second section 12 and the third section 13 may be uniform in height.

Figure 2D:
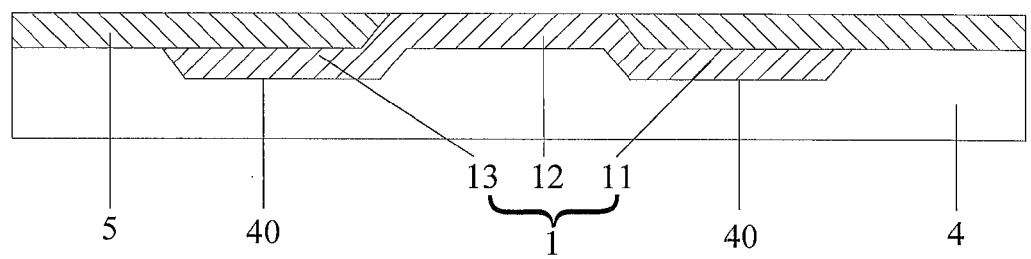

S4, as illustrated in FIG. 2d, the filling layer 5 located over the second section 12 of the gate electrode 1 is removed.

Specifically, an ashing process may be performed on the whole filling layer 5, so as to remove the filling layer of a transparent resin material over the second section 12, and after the filling layer 5 over the second section 12 is removed, it is also possible that the second section 12 and the remaining filling layer 5 are formed into a plane. That is, a surface of the remaining filling layer 5 is flush with a surface of the second section 12.

Figure 2E:
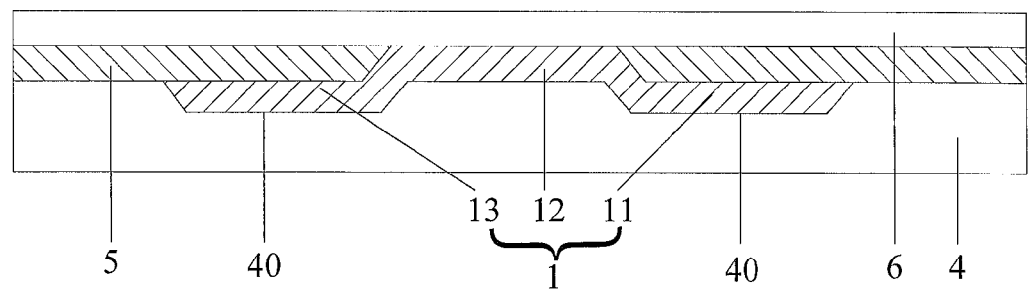

S5: as illustrated in FIG. 2e, after the above steps being accomplished, pattern of a gate insulating layer 6 is formed through a patterning process.

The gate insulating layer 6 may have a certain pattern that is formed in other region of the base substrate 4, such as, a via hole formed in a non-display region, acting for transmitting a gate drive signal to a gate line, and thus, individual drawings of embodiments of the invention each do not show the via hole in the gate insulating layer 6.

Figure 2F:
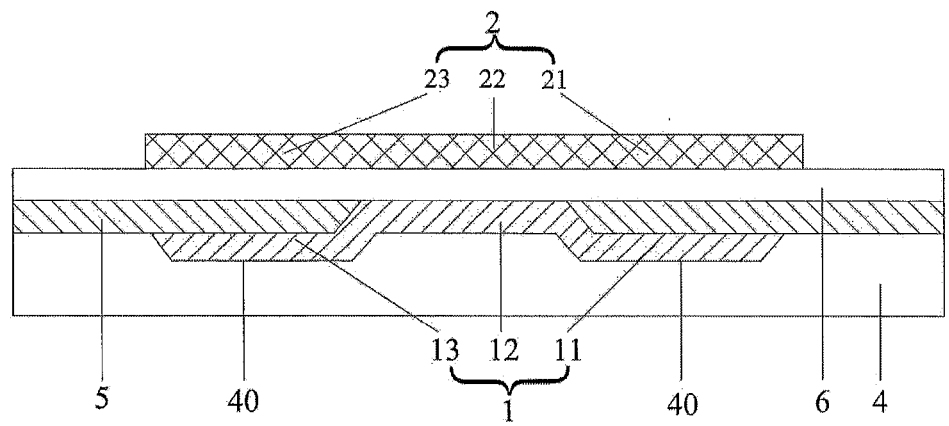

S6, as illustrated in FIG. 2f, after the above steps being accomplished, pattern of an active layer 2 is formed through a patterning process.

In the embodiment, material for the active layer 2 is an oxide semiconductor. In other embodiments, material for the active layer 2 may also be other kind of semiconductor.

For example, the active layer 2 includes a channel zone 22 located in the middle and a source zone 21 and a drain zone 23 located on both sides of the channel zone 22, and the source zone 21, the channel zone 22 and the drain zone 23 are disposed in opposition to the first section 11, the second section 12 and the third section 13 of the gate electrode 1, respectively.

Figure 2G:
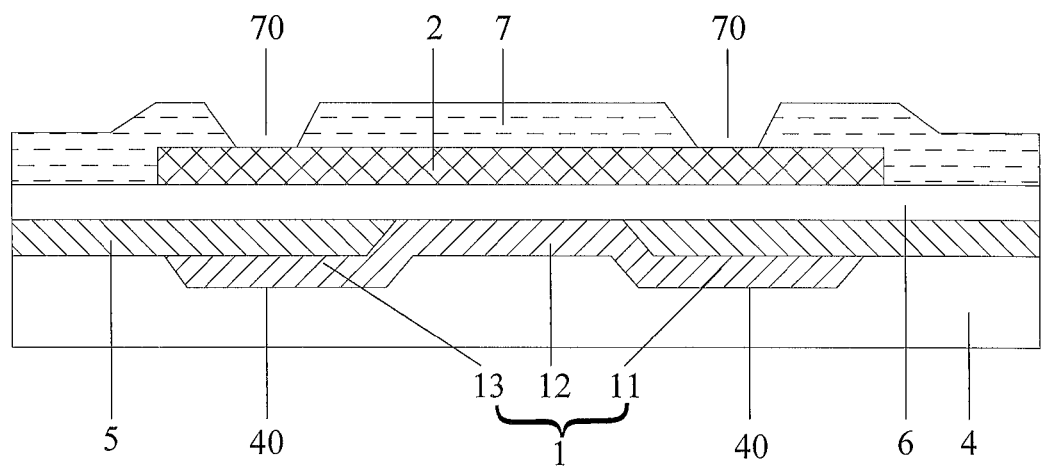

S7, as illustrated in FIG. 2g, after the above steps being accomplished, pattern of an etch stop layer 7 is formed through a patterning process, and via holes 70 are provided in the etch stop layer 7.

Figure 2H:
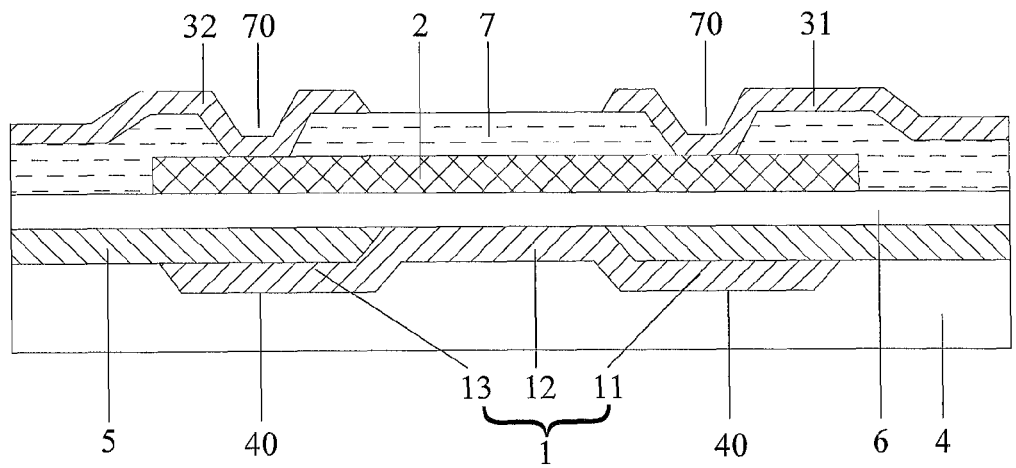

S8, as illustrated in FIG. 2h, after the above steps being accomplished, pattern of a source electrode 31 and a drain electrode 32 is formed through a patterning process. The source electrode 31 corresponds to a location of the first section 11 of the gate electrode 1, the drain electrode 32 corresponds to a location of the third section 13 of the gate electrode 1, and the source electrode 31 and the drain electrode 32 are connected to the active layer 2 through the via holes 70 in the etch stop layer 7.

For example, the source electrode 31 and the drain electrode 32 are connected to the source zone 21 and the drain zone 23 of the active layer 2, respectively.

The above steps S5 to S8 can each be carried out through a conventional patterning process, and are not described in detail any more here. Upon completion of the above steps, the thin film transistor provided by embodiments of the invention can be produced.

It is also to be noted that, the active layer in the embodiment is of an oxide semiconductor material, and the etch stop layer formed in the Step S7 is used to protect the active layer of the oxide semiconductor material. In other embodiments, if material for the active layer is other material than oxide semiconductors, then the step S7 can be omitted, and it proceeds to step S8 directly.

According to an embodiment of the invention, there is further provided an array substrate, with a number of thin film transistors provided by the above embodiments arranged in an array form being provided thereon.

Figure 3:
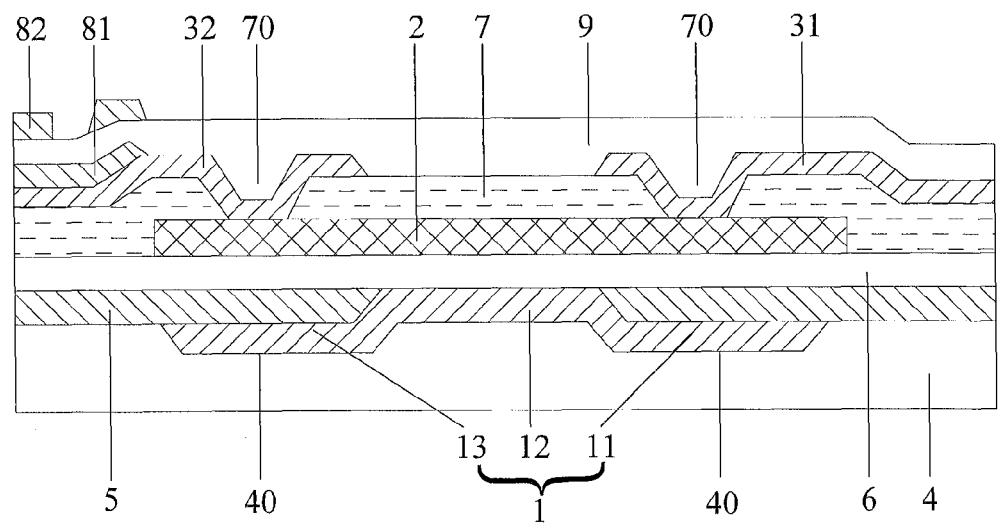
FIG. 3 is a schematic view illustrating an array substrate provided by an embodiment of the invention.

As an example, the array substrate provided by the embodiment is an Advanced super Dimension Switch (ADSDS) mode array substrate. As illustrated in FIG. 3, on the array substrate, the thin film transistor provided by the above embodiments is formed, and a pixel electrode 81 connected to the drain electrode 32, a protective layer 9 that covers the thin film transistor and the pixel electrode 81 and a common electrode 82 formed on the protective layer 9 are formed besides.

Certainly, in other embodiments, it may also be a Twisted Nematic (TN) mode array substrate, or an array substrate of other type. In an embodiment of the TN mode array substrate, on the basis of forming the above thin film transistor, only a protective layer has to be formed after a pixel electrode connected to a drain electrode is formed.

According to an embodiment of the invention, there is further provided a display device, comprising the array substrate provided by the above embodiments. The display device may be a liquid crystal panel, a liquid crystal television, a liquid crystal display, a digital photo frame, a cell phone, a tablet computer or any other product or component having a display function.

As the array substrate and the display device provided by embodiments of the invention have the same technical features as the thin film transistor provided by the embodiments of the invention as stated above, they can bring about the same technical effects and solve the same technical issues as well.

Descriptions made above are merely exemplary embodiments of the invention, but are not used to limit the protection scope of the invention. The protection scope of the invention is determined by attached claims.

The invention claimed is:

1. A thin film transistor, comprising a gate electrode, an active layer, a source electrode and a drain electrode, and being formed on a base substrate, wherein,
   the gate electrode includes a first section, a second section and a third section, the first section and the third section are located on both sides of the second section, respectively, the first section corresponds to a location of the source electrode, and the third section corresponds to a location of the drain electrode;
   the base substrate has two recesses formed therein, and in a thickness direction of the base substrate, the first section and the third section are situated in the two recesses, respectively;
   the first section and the third section are covered with a filling layer;
   the filling layer and the second section are covered with a gate insulating layer;
   the active layer is disposed on the gate insulating layer;
   the source electrode and the drain electrode are located over the active layer, and are connected to the active layer.

2. The thin film transistor according to claim 1, wherein, depth of the recesses is in the range of 0.3 to 1.0 μm.

3. The thin film transistor according to claim 2, wherein, depth of the recesses is 0.5 μm.

4. The thin film transistor according to claim 1, wherein, material for the active layer is an oxide semiconductor.

5. The thin film transistor according to claim 4, wherein, the active layer is covered with an etch stop layer, the etch stop layer has via holes provided therein, and the source electrode and the drain electrode are connected to the active layer through the via holes.

6. The thin film transistor according to claim 1, wherein, material for the filling layer is a transparent resin.

7. The thin film transistor according to claim 6, wherein, material for the filling layer is a polyacrylamide resin.

8. The thin film transistor according to claim 1, wherein, the active layer includes a channel zone located in the middle and a source zone and a drain zone located on both sides of the channel zone, and the source zone, the channel zone and the drain zone are disposed in opposition to the first section, the second section and the third section of the gate electrode, respectively.

9. The thin film transistor according to claim 8, wherein, the source electrode and the drain electrode are connected to the source zone and the drain zone of the active layer, respectively.

10. A manufacturing method of a thin film transistor, comprising:
   etching a base substrate, so as to form two recesses;
   forming pattern of a gate electrode on the base substrate through a patterning process, the gate electrode including a first section, a second section and a third section, the first section and the third section being located on both sides of the second section, respectively, and being situated in the two recesses, respectively;
   covering the gate electrode with a filling layer;
   removing the filling layer located over the second section;
   forming pattern of a gate insulating layer through a patterning process;
   forming pattern of an active layer through a patterning process;
   forming pattern of a source electrode and a drain electrode through a patterning process, the source electrode corresponding to a location of the first section, and the drain electrode corresponding to a location of the third section.

11. The manufacturing method according to claim 10, wherein, material for the active layer is an oxide semiconductor.

12. The manufacturing method according to claim 11, wherein, after the pattern of the active layer is formed through a pattering process, further comprising:
   forming pattern of an etch stop layer through a patterning process, with via holes being provided in the etch stop layer;
   making the source electrode and the drain electrode formed subsequently be connected to the active layer through the via holes.

13. An array substrate, with a number of thin film transistors according to claim 1 arranged in an array form being provided thereon.

14. The thin film transistor according to claim 2, wherein, material for the filling layer is a transparent resin.

15. The thin film transistor according to claim 3, wherein, material for the filling layer is a transparent resin.

16. The thin film transistor according to claim 4, wherein, material for the filling layer is a transparent resin.

17. The thin film transistor according to claim 2, wherein, the active layer includes a channel zone located in the middle and a source zone and a drain zone located on both sides of the channel zone, and the source zone, the channel zone and the drain zone are disposed in opposition to the first section, the second section and the third section of the gate electrode, respectively.

18. The thin film transistor according to claim 1, wherein, the second section is exposed by the filling layer.

19. The thin film transistor according to claim 1, wherein, the second section is situated outside of the two recesses.

20. The manufacturing method according to claim 11, wherein, in a thickness direction of the base substrate, the first section and the third section are situated in the two recesses, respectively.

* * * * *